US012660522B2

(12) United States Patent
Chin et al.

(10) Patent No.: US 12,660,522 B2
(45) Date of Patent: Jun. 16, 2026

(54) ANISOTROPIC EPITAXIAL GROWTH OF SILICON GERMANIUM

(71) Applicant: Applied Materials, Inc., Santa Clara, CA (US)

(72) Inventors: Chia Cheng Chin, Fremont, CA (US); Abhishek Dube, Fremont, CA (US); Yi-Chiau Huang, Fremont, CA (US); Saurabh Chopra, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 198 days.

(21) Appl. No.: 17/615,877

(22) PCT Filed: May 7, 2020

(86) PCT No.: PCT/US2020/031809
§ 371 (c)(1),
(2) Date: Dec. 2, 2021

(87) PCT Pub. No.: WO2021/021265
PCT Pub. Date: Feb. 4, 2021

(65) Prior Publication Data
US 2022/0319844 A1 Oct. 6, 2022

Related U.S. Application Data

(60) Provisional application No. 62/879,083, filed on Jul. 26, 2019.

(51) Int. Cl.
*C30B 25/16* (2006.01)
*C30B 25/02* (2006.01)
(Continued)

(52) U.S. Cl.
CPC .......... *H10P 14/3466* (2026.01); *C30B 25/02* (2013.01); *C30B 25/04* (2013.01);
(Continued)

(58) Field of Classification Search
CPC ..... C30B 23/00; C30B 23/002; C30B 23/005; C30B 23/02; C30B 25/00; C30B 25/02;
(Continued)

(56) References Cited

U.S. PATENT DOCUMENTS 7,166,528 B2 1/2007 Kim et al.
7,517,775 B2 4/2009 Kim et al.
(Continued)

FOREIGN PATENT DOCUMENTS

CN 1875461 A 12/2006
CN 101483136 A 7/2009
(Continued)

OTHER PUBLICATIONS

Pribat, et al. publication entitled "Anisotropy effects during non-selective epitaxial growth of Si and SiGe materials," Journal of Crystal Growth, vol. 334, pp. 138-145 (2011). (Year: 2011).*
(Continued)

*Primary Examiner* — Kenneth A Bratland, Jr.
(74) *Attorney, Agent, or Firm* — Patterson + Sheridan, LLP

(57) ABSTRACT

Generally, examples described herein relate to methods and semiconductor processing systems for anisotropically epitaxially growing a material on a silicon germanium (SiGe) surface. In an example, a surface of silicon germanium is formed on a substrate. Epitaxial silicon germanium is epitaxially grown on the surface of silicon germanium. A first growth rate of the epitaxial silicon germanium is in a first direction perpendicular to the surface of silicon germanium, and a second growth rate of the epitaxial silicon germanium
(Continued)

is in a second direction perpendicular to the first direction. The first growth rate is at least 5 times greater than the second growth rate.

19 Claims, 6 Drawing Sheets

(51) Int. Cl.

| | |
|---|---|
| *C30B 25/04* | (2006.01) |
| *C30B 25/18* | (2006.01) |
| *C30B 25/20* | (2006.01) |
| *C30B 29/52* | (2006.01) |
| *H10D 30/01* | (2025.01) |
| *H10D 30/62* | (2025.01) |
| *H10D 30/69* | (2025.01) |
| *H10D 62/13* | (2025.01) |
| *H10D 62/40* | (2025.01) |
| *H10D 62/832* | (2025.01) |
| *H10D 62/834* | (2025.01) |
| *H10P 14/20* | (2026.01) |
| *H10P 14/24* | (2026.01) |

(52) U.S. Cl.

CPC ............ *C30B 25/16* (2013.01); *C30B 25/186* (2013.01); *C30B 25/205* (2013.01); *C30B 29/52* (2013.01); *H10D 30/024* (2025.01); *H10D 30/6211* (2025.01); *H10D 30/797* (2025.01); *H10D 62/151* (2025.01); *H10D 62/405* (2025.01); *H10D 62/832* (2025.01); *H10D 62/834* (2025.01); *H10P 14/20* (2026.01); *H10P 14/24* (2026.01); *H10P 14/3411* (2026.01); *H10P 14/3444* (2026.01)

(58) Field of Classification Search

CPC ......... C30B 25/04; C30B 25/16; C30B 25/18; C30B 25/183; C30B 25/186; C30B 25/205; C30B 29/00; C30B 29/10; C30B 29/02; C30B 29/06; C30B 29/08; C30B 29/52; H01L 21/026009; H01L 21/02532; H01L 21/02579; H01L 21/0262; H01L 21/02634; H01L 29/045; H01L 29/0847; H01L 29/161; H01L 29/167; H01L 29/66795; H01L 29/7848; H01L 29/7851

USPC ........ 117/84, 88–89, 93, 101–102, 105, 902, 117/937, 939

See application file for complete search history.

(56) References Cited

U.S. PATENT DOCUMENTS

| | | | |
|---|---|---|---|
| 7,737,007 | B2 | 6/2010 | Samoilov et al. |
| 8,518,772 | B2 | 8/2013 | Bai et al. |
| 9,530,638 | B2 | 12/2016 | Dube et al. |
| 9,929,055 | B2 | 3/2018 | Dube et al. |
| 10,510,762 | B2 | 12/2019 | Chiou et al. |
| 10,840,094 | B2 | 11/2020 | Maeda et al. |
| 2005/0079691 | A1 | 4/2005 | Kim et al. |
| 2005/0277272 | A1 | 12/2005 | Singh et al. |
| 2006/0234488 | A1 | 10/2006 | Kim et al. |
| 2007/0048956 | A1 | 3/2007 | Dip et al. |
| 2007/0264801 | A1 | 11/2007 | Cody et al. |
| 2009/0011578 | A1 | 1/2009 | Samoilov et al. |
| 2011/0306204 | A1 | 12/2011 | Bai et al. |
| 2012/0138897 | A1* | 6/2012 | Lin .................. H01L 21/02639 257/E21.103 |
| 2016/0126093 | A1 | 5/2016 | Dube et al. |
| 2017/0178962 | A1 | 6/2017 | Dube et al. |
| 2017/0358643 | A1 | 12/2017 | Cheng et al. |
| 2018/0175046 | A1* | 6/2018 | Chiou ................. H10D 30/024 |
| 2019/0206679 | A1 | 7/2019 | Maeda et al. |

FOREIGN PATENT DOCUMENTS

| | | | |
|---|---|---|---|
| CN | 102938377 | A | 2/2013 |
| CN | 107546108 | A | 1/2018 |
| CN | 108231684 | A | 6/2018 |
| CN | 109148582 | A | 1/2019 |
| CN | 109994369 | A | 7/2019 |
| DE | 102017111540 | A1 | 6/2018 |
| JP | 2009-536786 | A | 10/2009 |
| JP | 5484729 | B2 | 5/2014 |
| KR | 20110135768 | A | 12/2011 |
| KR | 10-1176668 | | 8/2012 |
| KR | 20180069668 | A | 6/2018 |
| TW | 201824547 | A | 7/2018 |
| WO | 2005038890 | | 4/2005 |
| WO | 2016069180 | A1 | 5/2016 |

OTHER PUBLICATIONS

C. Pribat, Didier Dutartre, Anisotropy effects during non-selective epitaxial growth of Si and SiGe materials, Journal of Crystal Growth 334 Elsvier (2011), pp. 138-145.

Search Report for Taiwan Application No. 109121557 dated Dec. 25, 2023.

Office Action for Taiwan Application No. 109121557 dated Dec. 26, 2023.

International Search Report and Written Opinion dated Aug. 26, 2020 for Application No. PCT/US2020/031809.

Office Action for Korean Application No. 10-2022-7006437 dated Jul. 14, 2024.

Search Report for Chinese Application No. 202080045902.0 dated Feb. 26, 2024.

Office Action for Chinese Application No. 202080045902.0 dated Dec. 18, 2024.

Office Action for Chinese Application No. 202080045902.0 dated Mar. 17, 2025.

* cited by examiner

ANISOTROPIC EPITAXIAL GROWTH OF SILICON GERMANIUM

BACKGROUND

Field

Examples described herein generally relate to the field of semiconductor processing, and more specifically, to anisotropic epitaxial growth for semiconductor processing.

Description of the Related Art

Reliably producing nanometer and smaller features is one of the key technology challenges for next generation very large scale integration (VLSI) and ultra large-scale integration (ULSI) of semiconductor devices. As the limits of circuit technology are pushed, the shrinking dimensions of VLSI and ULSI technology have placed additional demands on processing capabilities. As the dimensions of the integrated circuit components are reduced (e.g., in nanometer dimensions), the materials and processes used to fabricate components are generally carefully selected in order to obtain satisfactory levels of electrical performance.

SUMMARY

Embodiments of the disclosure include a method for semiconductor processing. A surface of silicon germanium is formed on a substrate. Epitaxial silicon germanium is epitaxially grown on the surface of silicon germanium. A first growth rate of the epitaxial silicon germanium is in a first direction perpendicular to the surface of silicon germanium, and a second growth rate of the epitaxial silicon germanium is in a second direction perpendicular to the first direction. The first growth rate is at least 5 times greater than the second growth rate.

Embodiments of the disclosure include a method for semiconductor processing. A (100) surface of silicon germanium is formed on a substrate. An epitaxial silicon germanium is epitaxially grown on the (100) surface of silicon germanium. Epitaxially growing the epitaxial silicon germanium includes using a germanium source precursor and a silicon source precursor. The germanium source precursor includes a chlorinated germane gas.

Embodiments of the disclosure further include a semiconductor processing system that includes a non-transitory computer-readable medium storing instructions that, when executed by a processor, cause a computer system to perform operations. The operations include epitaxially growing an epitaxial silicon germanium on a (100) surface of silicon germanium. The (100) surface of silicon germanium is on a substrate. Epitaxially growing the epitaxial silicon germanium includes using a germanium source precursor and a silicon source precursor, and the germanium source precursor includes a chlorinated germane gas.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

To facilitate understanding, identical reference numerals have been used, wherever possible, to designate identical elements that are common to the figures.

DETAILED DESCRIPTION

Figures 1A, 1B, 2A, 2B:
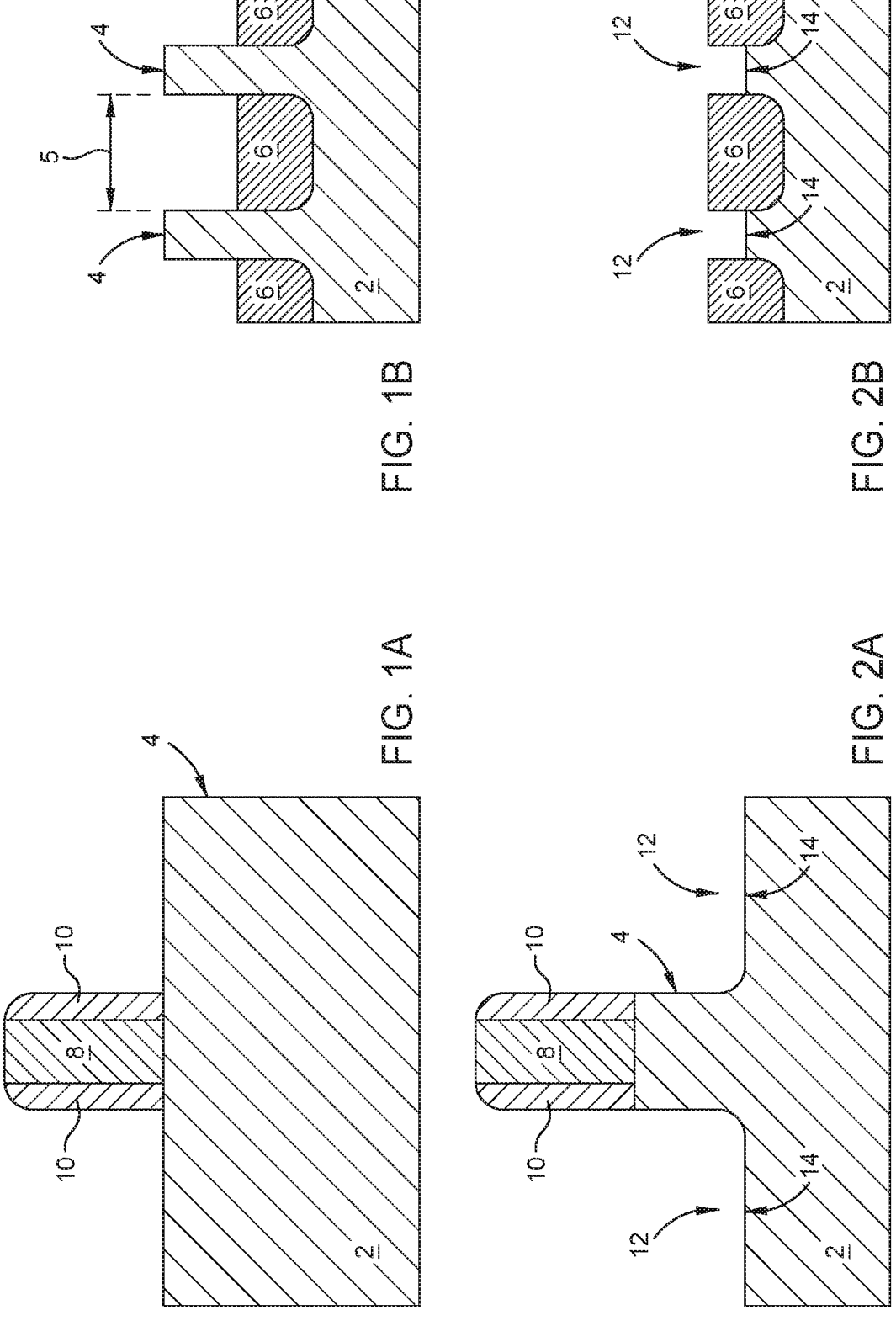
FIGS. 1A, 1B, 2A, 2B, 3A, and 3B are cross-sectional views of respective intermediate structures during processing to form fin field effect transistors (finFETs) according to some examples of the present disclosure.

Generally, examples described herein relate to methods and semiconductor processing systems for anisotropically epitaxially growing a material on a silicon germanium (SiGe) surface. Some examples more particularly relate to anisotropically epitaxially growing silicon germanium (such as boron-doped silicon germanium (SiGe(B))) on a silicon germanium surface. Some examples described herein provide for anisotropically epitaxially growing silicon germanium (such as SiGe(B)) on a (100) surface of silicon germanium, e.g., without substantial lateral growth, such that a (110) surface is not formed. Various surface orientations and directions are described herein using the notation of the Miller indices, as a person of ordinary skill in the art will readily understand. In some examples, anisotropically epitaxially growing silicon germanium is performed using germanium tetrachloride ($GeCl_4$).

Silicon substrates (e.g., wafers) are ubiquitous in semiconductor processing. Various devices manufactured on such substrates have been discovered to have improved operation when manufactured with a different material. For example, p-type field effect transistors (FETs) (such as fin FETs (finFETs)) have been discovered to have improved performance with compressively strained silicon germanium as a channel region. Further, for example, p-type FETs have been discovered to have improved performance with integrating silicon germanium in source/drain regions, e.g., to induce compressive stress to a channel region. In p-type FETs, a compressively strained and/or stressed channel region can increase hole mobility to therefore increase drive current, which results in increased performance. Accordingly, it is anticipated that use of silicon germanium in semiconductor processing will increase.

A challenge in integrating silicon germanium in some devices has been discovered to be the directionality of epitaxial growth of silicon germanium. As dimensions between devices decrease, epitaxial growth of silicon germanium in multiple directions can cause silicon germanium grown for different devices to merge together. This merging of silicon germanium can be disadvantageous in some circumstances. For example, if silicon germanium is incorporated into source/drain regions of finFETs, merging of the silicon germanium of different source/drain regions causes those source/drain regions to be at a same electrical potential, and hence, can cause the corresponding finFETs to be defective.

Some examples described herein can anisotropically grow silicon germanium on a silicon germanium surface. For example, silicon germanium can be vertically grown with a reduced and/or eliminated lateral growth component. More specifically, some examples described herein can anisotropically grow silicon germanium on a (100) silicon germanium surface without substantial lateral growth, such that a (110) surface of the silicon germanium is not formed. Accordingly, when the silicon germanium is incorporated into a recessed fin as a source/drain region, the anisotropically epitaxially grown silicon germanium can more closely replicate the original topography of the fin and can reduce the likelihood of merging with silicon germanium epitaxially grown on another, neighboring fin, even, e.g., at reduced dimensions between the fins.

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

Figures 3A, 3B, 4A, 4B:
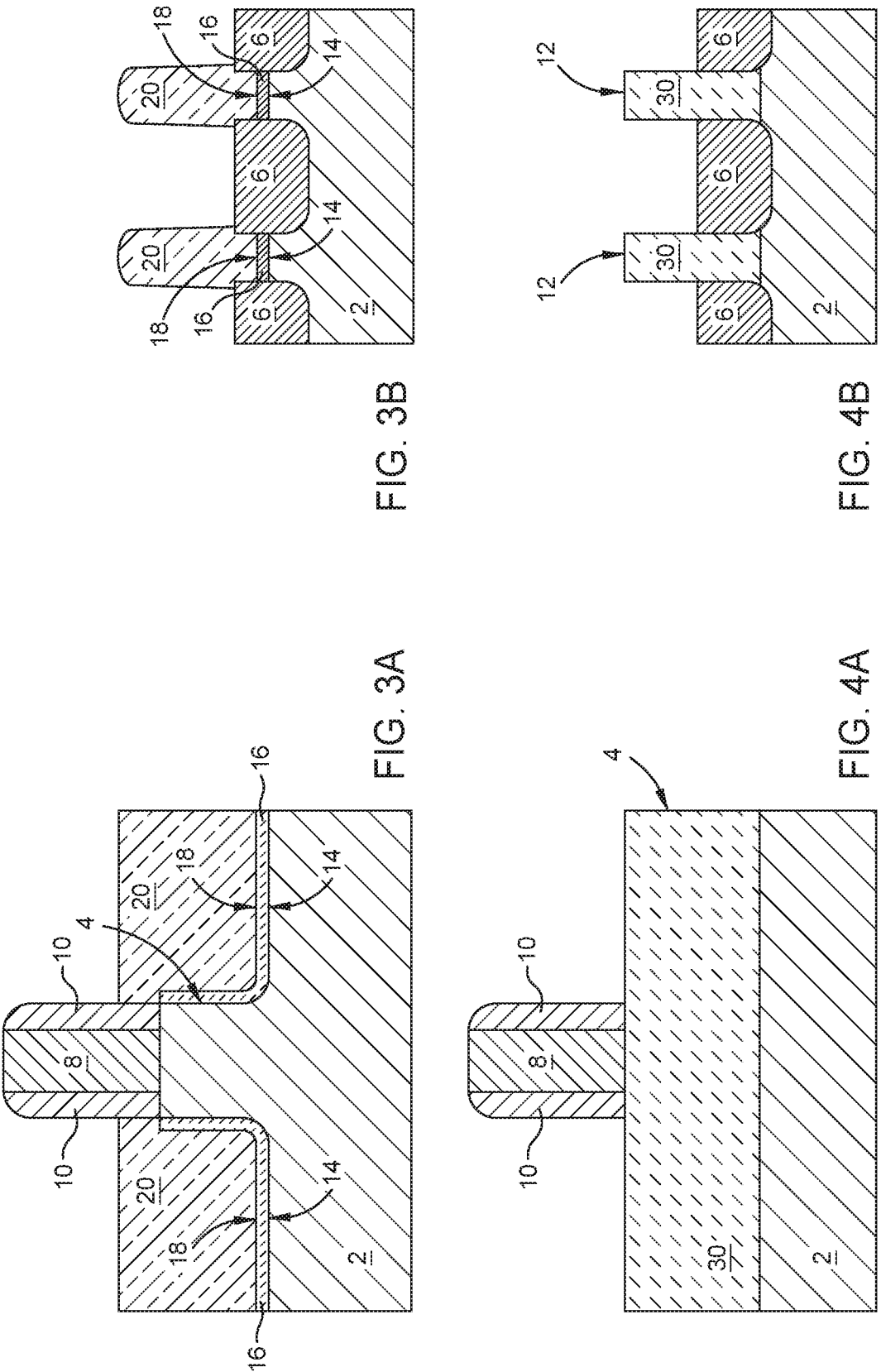
FIGS. 4A, 4B, 5A, 5B, 6A, and 6B are cross-sectional views of respective intermediate structures during processing to form finFETs according to some examples of the present disclosure.

FIGS. 1A, 1B, 2A, 2B, 3A, and 3B illustrate cross-sectional views of respective intermediate structures during processing to form finFETs according to some examples. FIGS. 1A, 2A, and 3A illustrate respective intermediate structures along a same cross-section, e.g., a plane along a fin through source/drain regions and a channel region in the fin. FIGS. 1B, 2B, and 3B illustrate respective intermediate structures along a same cross-section, e.g., a plane intersecting fins at respective source/drain regions in the fins. The cross-section of FIGS. 1A, 2A, and 3A is perpendicular to the cross-section of FIGS. 1B, 2B, and 3B.

FIGS. 1A and 1B illustrate an intermediate structure comprising fins 4 formed on a substrate 2 with a gate structure 8 formed on the fins 4. To obtain the intermediate structure of FIGS. 1A and 1B, a substrate 2 is provided. The substrate 2 can be any appropriate semiconductor substrate, such as a bulk substrate, semiconductor-on-insulator (SOI) substrate, or the like. In some examples, the substrate 2 is a bulk silicon wafer. Examples of substrate sizes include 200 mm diameter, 350 mm diameter, 400 mm diameter, and 450 mm diameter, among others.

Fins 4 are then formed on the substrate 2. The fins 4 can be formed by etching trenches into the substrate 2 such that each fin 4 is defined between a neighboring pair of trenches. The trenches may be etched using a multiple patterning process, such as self-aligned double patterning (SADP), lithography-etch-lithography-etch (LELE) double patterning, etc., to achieve a dimension 5 between fins 4. An example etch process to etch the trenches includes a reactive ion etch (RIE) process or the like.

Isolation structures 6 are formed in the trenches between the fins 4. In some examples, the isolation structures 6 may be referred to as shallow trench isolations (STIs). A dielectric material can be formed in the trenches. The dielectric material can be or include an oxide (e.g., silicon oxide) deposited by flowable chemical vapor deposition (FCVD) or the like, for example. The dielectric material is then recessed, e.g., by a wet etch to form the isolation structures 6 such that the fins 4 protrude above the isolation structures 6. Hence, in some examples, the isolation structures 6 include the dielectric material that was formed in the trenches.

A gate structure 8 is formed on the fins 4. In some examples, the gate structure 8 is a dummy gate structure that is subsequently removed for a replacement gate process. In other examples, the gate structure 8 can be a functional gate structure. In a dummy gate structure, the gate structure 8 can include an interfacial dielectric layer along the fins 4, a dummy gate layer on the interfacial dielectric layer, and a mask layer on the dummy gate layer. For example, the interfacial dielectric layer can be formed on the fins 4 using oxidation (e.g., plasma, chemical, and/or thermal oxidation) or can be deposited using an appropriate deposition process (e.g., atomic layer deposition (ALD), chemical vapor deposition (CVD), etc.). The dummy gate layer can then be deposited (e.g., by CVD, physical vapor deposition (PVD), etc.) on the interfacial dielectric layer and planarized (e.g., by a chemical mechanical planarization (CMP)). The mask layer can then be deposited (e.g., by CVD, PVD, etc.) on the dummy gate layer. In some examples, the interfacial dielectric layer is an oxide; the dummy gate layer is silicon, such as amorphous silicon and/or polysilicon; and the mask layer is silicon nitride, silicon carbon nitride, silicon oxynitride, etc. The mask layer, dummy gate layer, and interfacial dielectric layer are then patterned into the gate structure 8 illustrated in FIG. 1A using an appropriate etch process, such as a RIE or the like.

Gate spacers 10 are formed along sidewalls of the gate structure 8. One or more dielectric layers can be deposited conformally along the surfaces of the fins 4, isolation structures 6, and gate structure 8 and anisotropically etched such that portions of the one or more dielectric layers remain along the sidewalls of the gate structure 8 to form the gate spacers 10. The one or more layers of the gate spacers 10 can be or include silicon nitride, silicon carbon nitride, silicon oxynitride, silicon carbon oxynitride, etc., and can be deposited using ALD, plasma-enhanced CVD (PECVD), the like, or a combination thereof. The one or more dielectric layers can be anisotropically etched using RIE or the like.

FIGS. 2A and 2B illustrate an intermediate structure where recesses 12 are formed in the fins 4. An etch process can be performed using the gate structure 8 (e.g., the mask layers of the gate structure 8) and the gate spacers 10 as masks for the etch process to form the recesses 12 in the fins 4. The etch process can be anisotropic and/or isotropic. For example, the etch process can be a RIE or the like, or can be a wet etch, such as using tetramethylammonium hydroxide (TMAH) or the like.

In some examples, a material of the fins 4 is silicon. For example, the substrate 2 can be a bulk silicon wafer in which the trenches are etched to form the fins 4. In another example, the substrate 2 can be a SOI substrate in which the semiconductor layer is silicon, and the trenches are etched into the silicon layer to form the fins 4. Etching the fins 4 to form the recesses 12 forms a bottom surface 14 in each recess 12. In some examples, the bottom surface 14 is a (100) surface. Hence, when the fin 4 is silicon, the bottom surface 14 can be a Si(100) surface.

FIGS. 3A and 3B illustrate an intermediate structure where source/drain regions 20 are formed in the recesses 12. A template layer 16 is formed along surfaces of each recess 12. The template layer 16 can be epitaxially grown on the surfaces of the recesses 12. The epitaxial growth may be performed using low pressure CVD (LPCVD), metal-organic CVD (MOCVD), liquid phase epitaxy (LPE), the like, or a combination thereof.

In some examples, such as when the fins 4 are silicon as described above, a material of the template layer 16 is silicon germanium ($Si_{1-x}Ge_x$, where x is in a range from about 10 to about 30). A thickness of the template layer 16 can be equal to or greater than 50 angstroms (Å). The template layer 16 of silicon germanium can be epitaxially grown using a germanium source precursor and a silicon source precursor. The germanium source precursor can be or comprise germane ($GeH_4$), a higher order germane, and organogermane. Higher order germanes include compounds with an empirical formula $Ge_xH_{(2x+2)}$, such as digermane ($Ge_2H_6$), trigermane ($Ge_3H_8$), and tetragermane Organogermanes include compounds with an empirical formula $R_yGe_xH_{(2x+2-y)}$, where R=methyl, ethyl, propyl or butyl, such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2$ $Ge_2H_4$) and hexamethyldigermane (($CH_3$)$_6Ge_2$). The silicon source precursor can be or comprise silane ($SiH_4$), a higher order silane, halogenated silane, and organosilane. Higher order silanes include compounds with an empirical formula $Si_xH_{(2x+2)}$, such as disilane ($Si_2H_6$), trisilane ($Si_3H_6$), and tetrasilane ($Si_4H_{10}$). Halogenated silanes include compounds with the empirical formula $X'_ySi_xH_{(2x+2-y)}$, where X'=F, Cl, Br or I, such as dichlorosilane ($SiH_2Cl_2$), tetrachlorosilane ($SiCl_4$), and hexachlorodisilane ($Si_2Cl_6$), and trichlorosilane ($SiHCl_3$). Organosilanes include compounds with an empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2$ $Si_2H_4$) and hexamethyldisilane (($CH_3$)$_6Si_2$).

A flow rate of the germanium source precursor can be in a range from about 10 standard cubic centimeters per minute (sccm) to about 200 sccm, and a flow rate of the silicon source precursor can be in a range from about 100 sccm to about 1000 sccm. A ratio of the flow rate of the germanium source precursor to the flow rate of the silicon source precursor can be in a range from about 1:5 to about 1.5:1. A pressure of an environment in a processing chamber in which the epitaxial growth is performed can be maintained in a range from about 5 Torr to about 40 Torr. A temperature of the substrate 2 during the epitaxial growth can be maintained at about 590° C. or above, such as about 600° C. or above, and more particularly in a range from about 600° C. to about 650° C.

An etchant can be flowed in the epitaxial growth process to selectively etch epitaxially grown material, such as grown on an amorphous surface (e.g., a dielectric surface). An etchant can be or comprise HCl, HF, HBr, $Br_2$, $Si_2Cl_6$, $SiCl_4$, $SiHCl_3$, $SiH_2Cl_2$, $CCl_4$, $Cl_2$, $GeCl_4$, $GeHCl_3$, or a combination thereof. A flow rate of an etchant gas can be in a range from about 0 sccm to about 100 sccm. A carrier gas (e.g., an inert gas), such as nitrogen ($N_2$), argon (Ar), the like, or a combination thereof, can be used in combination with the germanium source precursor, silicon source precursor, etchant, and/or a combination thereof.

In some examples, the template layer 16 can be doped, such as boron-doped silicon germanium ($Si_{1-x}Ge_x$(B) or more generally, SiGe(B)). A concentration of a dopant in the template layer 16 can be in a range from about $1\times10^{18}$ cm$^{-3}$ to about $4\times10^{20}$ cm$^{-3}$. A dopant source can be flowed during the epitaxial growth of the template layer 16 to in situ dope the template layer 16. The dopant source can be or comprise a borane, organoborane (e.g., alkylboranes), and boron halide. Boranes include borane ($BH_3$), diborane ($B_2H_6$), triborane ($B_3H_5$), tetraborane ($B_4H_{10}$), pentaborane(9) ($B_5H_9$), pentaborane(11), hexaborane(10) ($B_6H_{10}$), hexaborane(12) ($B_6H_{12}$), and decaborane(14) ($B_{10}H_{14}$), while alkylboranes include compounds with an empirical formula $R_xBH_{(3-x)}$, where R=methyl, ethyl, propyl or butyl and x=0, 1, 2 or 3. Alkylboranes include trimethylborane (($CH_3$)$_3B$), dimethylborane (($CH_3$)$_2BH$), triethylborane (($CH_3CH_2$)$_3B$), and diethylborane (($CH_3CH_2$)$_2BH$). Boron halides include electron deficient boron halides such as boron trifluoride ($BF_3$), boron trichloride ($BCl_3$), and boron tribromide ($BBr_3$). A flow rate of the dopant source can be in a range from about 5 sccm to about 30 sccm. Other dopants, such as arsenide and phosphorus, may be implemented in other examples, and hence, different dopant sources can be used.

The epitaxial growth of the template layer 16 can cause surfaces of the template layer 16 to replicate surfaces of the recess 12 on which the template layer 16 is grown. Accordingly, the template layer 16 can have a surface 18 that replicates the bottom surface 14 of the recess 12. In some examples, where the bottom surface 14 is a Si(100) surface, the surface 18 of the template layer 16 can be a SiGe(100) surface.

The source/drain regions 20 are formed on the template layers 16 in the recesses 12. Each source/drain region 20 is anisotropically grown from one or more surfaces of the corresponding template layer 16. The epitaxial growth may be performed using LPCVD, MOCVD, LPE, the like, or a combination thereof. The anisotropic growth of the source/drain region 20 permits the source/drain region 20 to more closely reproduce the original topography of the respective fin 4 (e.g., before the forming recesses 12 in the fin 4). Top surfaces of the source/drain regions 20 can be above respective top surfaces of fins 4 (e.g., as raised source/drain regions), such as shown in FIG. 3A.

In some examples, a material of the source/drain regions 20 is silicon germanium ($Si_{1-y}Ge_y$, where y is in a range from about 30 to about 50), which may be doped, such as by boron (e.g., boron-doped silicon germanium (SiGe(B))). A concentration of a dopant in the source/drain regions 20 can be in a range from about $1\times10^{20}$ cm$^{-3}$ to about $1\times10^{22}$ cm$^{-3}$. The source/drain regions 20 of silicon germanium can be epitaxially grown using a germanium source precursor and a silicon source precursor. The germanium source precursor can be or comprise a chlorinated germane gas. Chlorinated germane gases include germanium tetrachloride ($GeCl_4$), dichlorogermane ($GeH_2Cl_2$), trichlorogermane ($GeHCl_3$), hexachloro-digermane ($Ge_2Cl_6$), or a combination thereof. The silicon source precursor can be or comprise silane ($SiH_4$), a higher order silane, halogenated silane, and organosilane. Higher order silanes include compounds with an empirical formula $Si_xH_{(2x+2)}$, such as disilane ($Si_2H_6$), trisilane ($Si_3H_6$), and tetrasilane ($Si_4H_{10}$). Halogenated silanes include compounds with the empirical formula $X'_ySi_xH_{(2x+2-y)}$, where X'=F, Cl, Br or I, such as dichlorosilane ($SiH_2Cl_2$), tetrachlorosilane ($SiCl_4$), and hexachlorodisilane ($Si_2Cl_6$), and trichlorosilane ($SiHCl_3$). Organosilanes include compounds with an empirical formula $R_ySi_x$ $H_{(2+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). A dopant source gas can be flowed during the epitaxial growth of the source/drain regions 20 to in situ dope the source/drain regions 20. The dopant source gas can be or comprise a borane, organoborane (e.g., alkylboranes), and boron halide. Boranes include borane ($BH_3$), diborane ($B_2H_6$), triborane ($B_3H_5$), tetraborane ($B_4H_{10}$), pentaborane (9) ($B_5H_9$), pentaborane(11), hexaborane(10) ($B_6H_{10}$), hexaborane(12) ($B_6H_{12}$), and decaborane(14) ($B_{10}H_{14}$), while alkylboranes include compounds with an empirical formula $R_xBH_{(3-x)}$, where R=methyl, ethyl, propyl or butyl and x=0, 1, 2 or 3. Alkylboranes include trimethylborane (($CH_3$)$_3$B), dimethylborane (($CH_3$)$_2$BH), triethylborane (($CH_3CH_2$)$_3$B) and diethylborane (($CH_3CH_2$)$_2$BH). Boron halides include electron deficient boron halides such as boron trifluoride ($BF_3$), boron trichloride ($BCl_3$), and boron tribromide ($BBr_3$).

A flow rate of the germanium source precursor can be in a range from about 50 sccm to about 500 sccm, and a flow rate of the silicon source precursor can be in a range from about 50 sccm to about 500 sccm. A ratio of the flow rate of the germanium source precursor to the flow rate of the silicon source precursor can be in a range from about 1:3 to about 1.5:1. A flow rate of the dopant source gas can be in a range from about 5 sccm to about 30 sccm. A carrier gas (e.g., an inert gas), such as nitrogen ($N_2$), argon (Ar), the like, or a combination thereof, can be used in combination with the germanium source precursor, the silicon source precursor, dopant source gas, or a combination thereof. A pressure of an environment in a processing chamber in which the epitaxial growth is performed can be maintained in a range from about 5 Torr to about 40 Torr. A temperature of the substrate 2 during the epitaxial growth can be maintained at about 500° C. or above, such as in a range from about 500° C. to about 700° C., and more particularly, in a range from about 540° C. to about 600° C.

Under these conditions, epitaxial growth of the silicon germanium can be anisotropically deposited. In some examples, where the surface 18 of the template layer 16 is a SiGe(100) surface, the source/drain regions 20 (e.g., SiGe(B)) can be anisotropically grown from the respective SiGe(100) surfaces in a <100> direction without substantial lateral growth in a <010> direction, such that a (110) surface is not formed. A lateral growth component of the source/drain region 20 can be suppressed. Suppression of a lateral growth component can reduce or eliminate a facet (e.g., a (110) surface) formed in the source/drain region 20. In some examples, the vertical growth rate (e.g., in a <100> direction) is at least 5 times greater than a lateral growth rate (e.g., perpendicular to the <100> direction). During the epitaxial growth process of the source/drain regions 20, chlorine dissociated from the chlorinated germane gas can etch lateral growth that can form a (110) surface. The combination of vertical deposition and etch rates and lateral deposition and etch rates result in a vertical growth rate that is significantly greater than a lateral growth rate. Hence, the silicon germanium source/drain regions 20 can more closely reproduce the original topography of the fins 4.

With a lateral growth rate of the epitaxial growth process used for growing the source/drain regions 20 suppressed, the dimension 5 between neighboring fins 4 can be reduced. The risk of merging source/drain regions 20 of neighboring fins 4 can be reduced, even with a decreased dimension 5, with the source/drain regions 20 more closely reproducing the original topography of the fins 4.

Subsequent processing may be performed on the intermediate structure of FIGS. 3A and 3B. For example, a contact etch stop layer (CESL) can be conformally formed on surfaces of the gate structure 8, gate spacers 10, source/drain region 20, and isolation structures 6. An interlayer dielectric (ILD0) can be formed on the CESL. A replacement gate process can be performed to remove the gate structure 8 and to form a functional gate structure where the gate structure 8 was removed. Further processing can be performed.

Figures 5A, 5B, 6A, 6B:
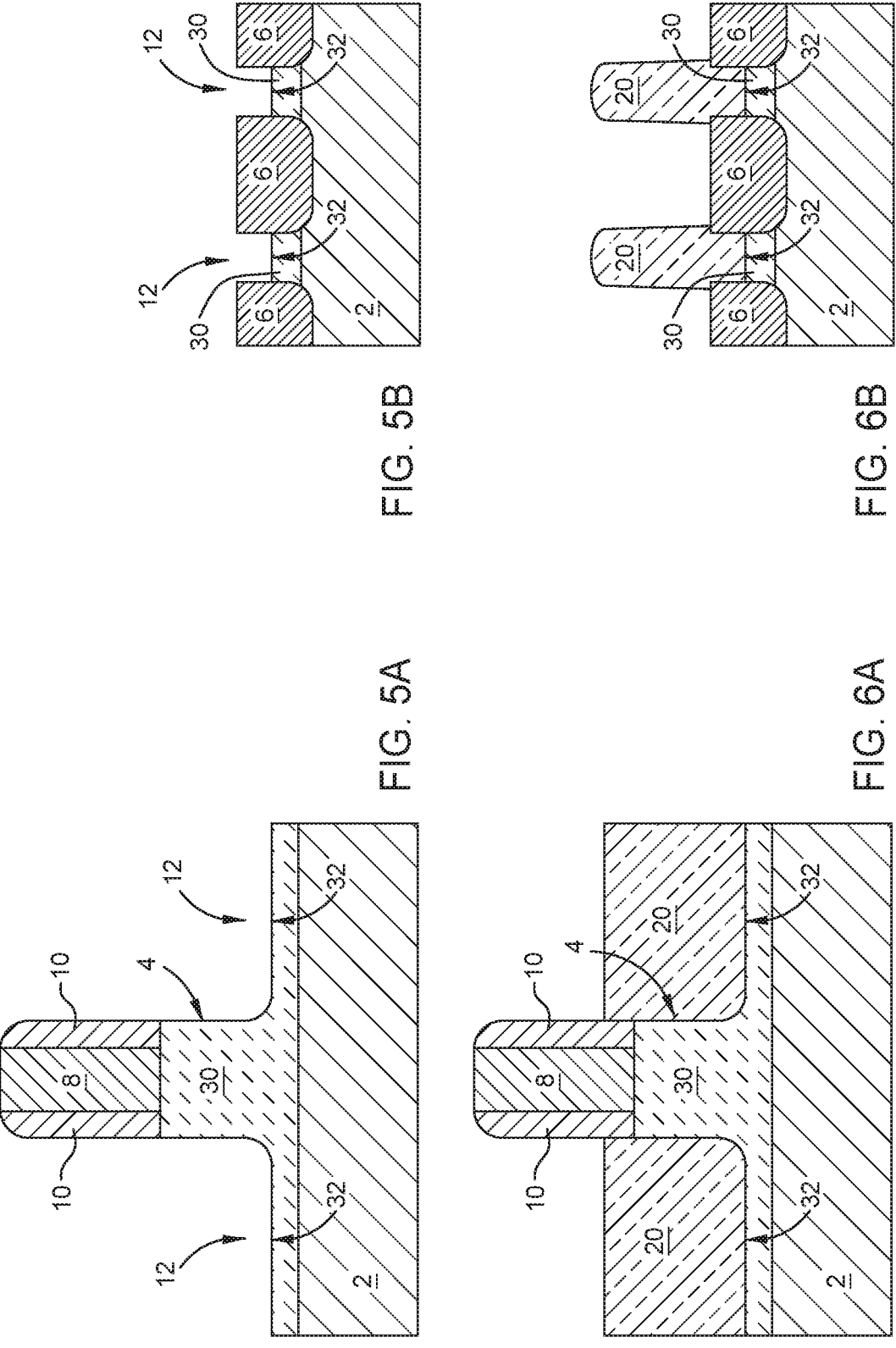

FIGS. 4A, 4B, 5A, 5B, 6A, and 6B illustrate cross-sectional views of respective intermediate structures during processing to form finFETs according to some examples. FIGS. 4A, 5A, and 6A illustrate respective intermediate structures along a same cross-section, e.g., a plane along a fin through source/drain regions and a channel region in the fin. FIGS. 4B, 5B, and 6B illustrate respective intermediate structures along a same cross-section, e.g., a plane intersecting fins at respective source/drain regions in the fins. The cross-section of FIGS. 4A, 5A, and 6A is perpendicular to the cross-section of FIGS. 4B, 5B, and 6B. Much of the description of FIGS. 1A through 3B is applicable to FIGS. 4A through 6B, as would be readily understood by a person having ordinary skill in the art, and hence, such description is omitted here for brevity.

FIGS. 4A and 4B illustrate an intermediate structure comprising fins 4 formed on a substrate 2 with a gate structure 8 formed on the fins 4. FIGS. 4A and 4B are similar to FIGS. 1A and 1B except that a heteroepitaxial layer 30 is formed on the substrate 2 and is used to form, at least in part, the fins 4. For example, the heteroepitaxial layer 30 can be epitaxially grown on the substrate 2. As an example, the substrate 2 can be a bulk silicon wafer, and the heteroepitaxial layer 30 can be silicon germanium ($Si_{1-x}Ge_x$, where x is in a range from about 10 to about 30). The fins 4 can be formed by etching trenches into and/or through the heteroepitaxial layer 30 and, possibly, into the substrate 2 such that each fin 4 is defined between a neighboring pair of trenches. The fins 4 include the etched heteroepitaxial layer 30.

FIGS. 5A and 5B illustrate an intermediate structure where recesses 12 are formed in the fins 4. The recesses 12 do not extend through the heteroepitaxial layer 30 in some examples. The recesses 12 have respective bottom surfaces 32 that are a surface of the heteroepitaxial layer 30.

In some examples, a material of the heteroepitaxial layer 30 is silicon germanium. In some examples, the bottom surface 32 is a (100) surface. Hence, when the heteroepitaxial layer 30 is silicon germanium, the bottom surface 32 can be a SiGe(100) surface.

FIGS. 6A and 6B illustrate an intermediate structure where source/drain regions 20 are formed in the recesses 12. The source/drain regions 20 are formed on the heteroepitaxial layer 30. Each source/drain region 20 is anisotropically grown from one or more surfaces of the heteroepitaxial layer 30. The anisotropic growth of the source/drain region 20 permits the source/drain region 20 to more closely reproduce the original topography of the respective fin 4 (e.g., before recesses 12 are formed in the fin 4). Top surfaces of the source/drain regions 20 can be above respective top surfaces of fins 4 (e.g., as raised source/drain regions), such as shown in FIG. 6A.

In some examples, a material of the source/drain regions 20 is silicon germanium ($Si_{1-y}Ge_y$, where y is in a range from about 30 to about 50), which may be doped, such as by boron (e.g., boron-doped silicon germanium (SiGe(B))). The source/drain regions 20 of silicon germanium can be epitaxially grown as described with respect to FIGS. 3A and 3B above. Epitaxial growth of the silicon germanium can be anisotropically deposited. In some examples, where the bottom surface 32 of the heteroepitaxial layer 30 is a SiGe(100) surface, the source/drain regions 20 (e.g., SiGe (B)) can be anisotropically grown from the respective SiGe (100) surface in a <100> direction without substantial lateral growth in a <010> direction, such that a (110) surface is not formed. A lateral growth component of the source/drain region 20 can be suppressed. Suppression of a lateral growth component can reduce or eliminate a facet (e.g., a (110) surface) formed in the source/drain region 20. In some examples, the vertical growth rate (e.g., in a <100> direction) is at least 5 times greater than a lateral growth rate (e.g., perpendicular to the <100> direction). During the epitaxial growth process of the source/drain regions 20, chlorine dissociated from the chlorinated germane gas can etch lateral growth that can form a (110) surface. The combination of vertical deposition and etch rates and lateral deposition and etch rates result in a vertical growth rate that is significantly greater than a lateral growth rate. Hence, the silicon germanium source/drain regions 20 can more closely reproduce the original topography of the fins 4.

Subsequent processing may be performed on the intermediate structure of FIGS. 6A and 6B, such as described above following FIGS. 3A and 3B.

Figure 7:
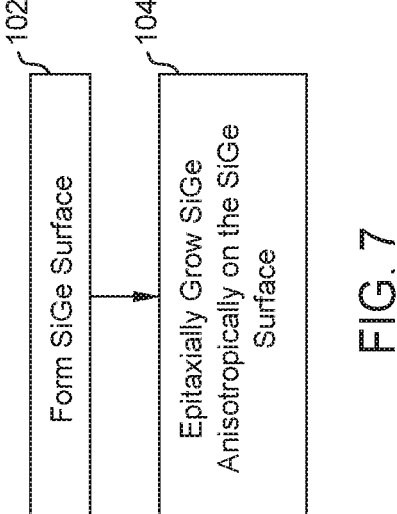
FIG. 7 is a flowchart of a method for semiconductor processing according to some examples of the present disclosure.

FIG. 7 is a flowchart of a method for semiconductor processing according to some examples. At block 102, a silicon germanium (SiGe) surface is formed. The SiGe surface can be formed a number of ways. The SiGe surface can be a (100) surface (e.g., a SiGe(100) surface). As illustrated in the processing depicted in FIGS. 1A through 3B, a SiGe(100) surface can be formed by epitaxially growing a template layer of SiGe on a (100) surface. A template layer of SiGe can be epitaxially grown as described above with respect to the example of a template layer 16 in FIGS. 3A and 3B. As illustrated in the processing depicted in FIGS. 4A through 6B, a SiGe(100) surface can be formed by etching a layer of SiGe to have a (100) surface. Etching a layer of SiGe to have a (100) surface can be performed as described above with respect to the example of etching the heteroepitaxial layer 30 in FIGS. 5A and 5B. In some examples, the SiGe surface can be doped, such as including boron.

At block 104, silicon germanium (SiGe) is anisotropically epitaxially grown on the SiGe surface. The SiGe can be boron-doped SiGe (SiGe(B)). A vertical growth rate of the SiGe (e.g., in a direction perpendicular to the SiGe surface) is at least 5 times greater than lateral growth rate of the SiGe (e.g., in a direction parallel to the SiGe surface). More particularly, for example, the SiGe can be anisotropically grown from a SiGe(100) surface in a <100> direction without substantial lateral growth in a <010> direction, such that a (110) surface is not formed, as described above with respect to the source/drain regions 20 in FIGS. 3A-3B and 6A-6B. More particularly, the epitaxial growth of the SiGe can comprise using a chlorinated germane gas, such as germanium tetrachloride (GeCl$_4$), as a precursor.

FIGS. 8A, 8B, 8C, and 8D illustrate experimental results of epitaxially growing SiGe(B) on a SiGe template layer, which was epitaxially grown on a Si substrate. In FIGS. 8A-8D, the effect of the substrate temperature during growth of the SiGe template layer was observed. In FIGS. 8A-8D, the SiGe template layer was epitaxially grown on a (110) surface of the Si substrate. The SiGe template layer was epitaxially grown using germane (GeH$_4$) and silane (SiH$_4$) precursors. A flowrate of the germane (GeH$_4$) precursor was 35 sccm, and a flowrate of the silane (SiH$_4$) precursor was 140 sccm. A pressure of an environment in a processing chamber in which the epitaxial growth was performed was 10 Torr. An epitaxial growth process was then performed to attempt to grow SiGe(B) on the SiGe template layer. The epitaxial growth process to attempt to grow SiGe(B) used germanium tetrachloride (GeCl$_4$) and silane (SiH$_4$) precursors. Diborane (B$_2$H$_6$) was used as a dopant source for in situ doping. A flowrate of the germanium tetrachloride (GeCl$_4$) precursor was 120 sccm; a flowrate of the silane (SiH$_4$) precursor was 160 sccm; and a flowrate of the diborane (B$_2$H$_6$) dopant source was 7 sccm. A pressure of an environment in a processing chamber in which the epitaxial growth was performed was 10 Torr. A temperature of the Si substrate during the epitaxial growth process to attempt to grow SiGe(B) was 540° C.

Figures 8A, 8B, 8C, 8D:
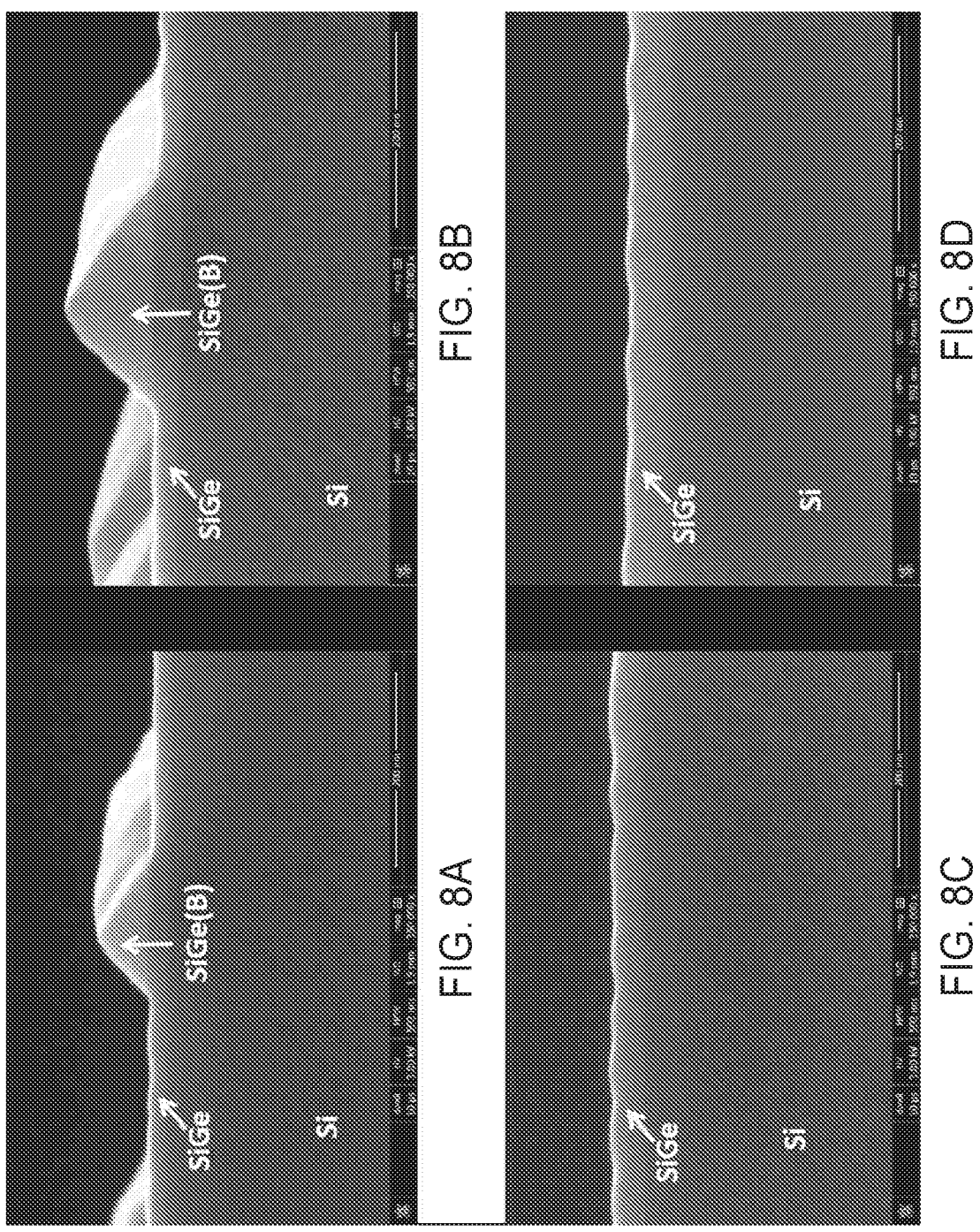
FIGS. 8A, 8B, 8C, and 8D show experimental results of epitaxially growing boron-doped silicon germanium on a silicon germanium template layer, which was epitaxially grown on a silicon substrate, according to some examples of the present disclosure.

In FIG. 8A, the SiGe template layer was Si$_{0.82}$Ge$_{0.18}$. A temperature of the Si substrate during the epitaxial growth of the SiGe template layer was 540° C. The SiGe template layer was grown to a thickness of approximately 20 nm. SiGe(B) was defectively grown on the SiGe template layer, as shown in FIG. 8A.

In FIG. 8B, the SiGe template layer was Si$_{0.82}$Ge$_{0.18}$. A temperature of the Si substrate during the epitaxial growth of the SiGe template layer was 560 ° C. The SiGe template layer was grown to a thickness of approximately 30 nm. SiGe(B) was defectively grown on the SiGe template layer, as shown in FIG. 8B.

In FIG. 8C, the SiGe template layer was Si$_{0.84}$Ge$_{0.16}$. A temperature of the Si substrate during the epitaxial growth of the SiGe template layer was 590° C. The SiGe template layer was grown to a thickness of approximately 32 nm. SiGe(B) was not grown on the SiGe template layer, as shown in FIG. 8C.

In FIG. 8D, the SiGe template layer was Si$_{0.86}$Ge$_{0.14}$. A temperature of the Si substrate during the epitaxial growth of the SiGe template layer was 650° C. The SiGe template layer was grown to a thickness of approximately 46 nm. SiGe(B) was not grown on the SiGe template layer, as shown in FIG. 8D.

As shown by FIGS. 8A-8D, whether SiGe(B) is epitaxially grown on a SiGe template layer may be affected by a temperature of the epitaxial growth of the SiGe template layer. It is believed that an increased temperature of the epitaxial growth of the SiGe template layer can increase a quality of the grown SiGe template layer. Hence, it is believed that the SiGe template layer can replicate the underlying (110) surface on which the SiGe template layer is grown more precisely at greater temperatures. A more precisely replicated (110) surface on the SiGe template layer can reduce or prohibit epitaxial growth of SiGe(B) thereon during a subsequent epitaxial growth process. Inversely, it is believed that a decreased temperature of the epitaxial growth of the SiGe template layer can decrease a quality of the grown SiGe template layer. Hence, it is believed that the SiGe template layer can be more defective when grown at lesser temperatures, and the more defective SiGe template layer can introduce, e.g., a (100) surface on which SiGe(B) can nucleate and grow during a subsequent epitaxial growth process. It is worth noting that the upper surface of the SiGe template layer in each of FIGS. 8C and 8D indicates some undulations. These undulations are believed to be a result of etching from an etching component (e.g., chlorine) during the subsequent epitaxial growth process and not as a result of defective epitaxial growth of the respective SiGe template layer. Accordingly, when a SiGe template layer (e.g., template layer 16) is implemented in some examples, such as illustrated by the processing of FIGS. 1A through 3B, the SiGe template layer may be epitaxially grown with a substrate temperature maintained at about 590° C. or above.

Figure 9:
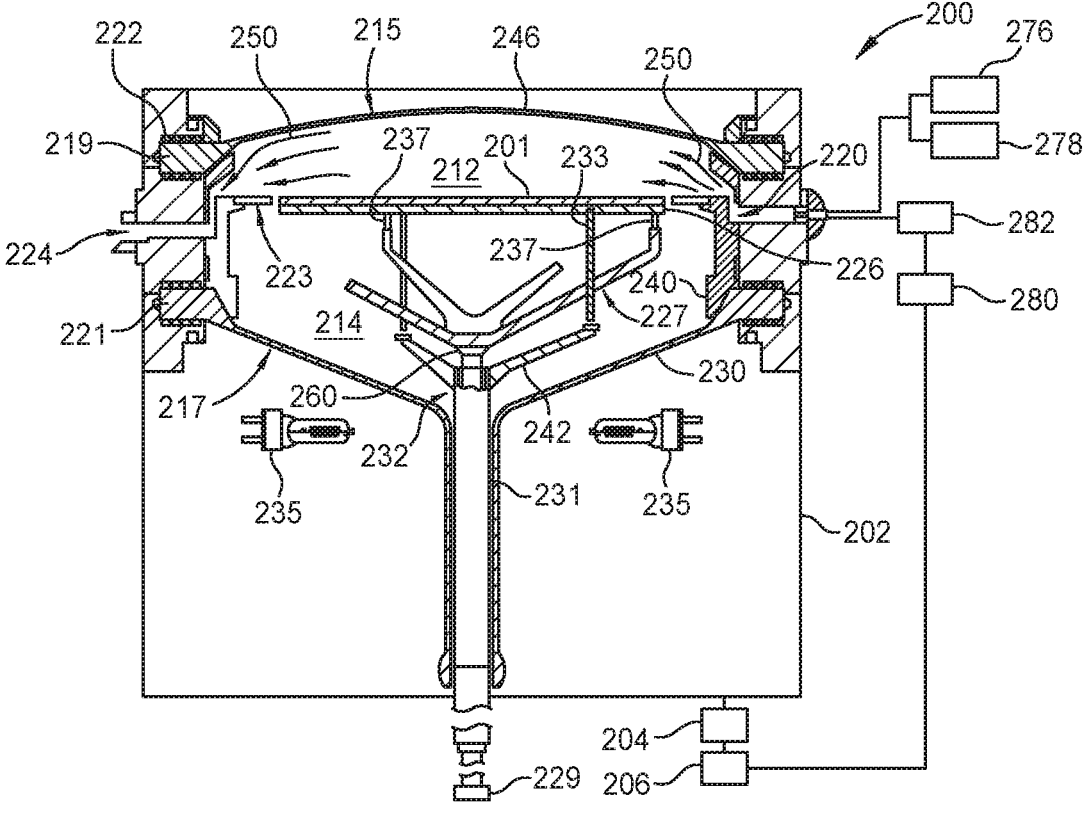
FIG. 9 is a cross-sectional view of a processing chamber that may be used to perform epitaxial growth according to some examples of the present disclosure.

FIG. 9 is a cross-sectional view of a processing chamber 200 that may be used to perform epitaxial growth. The processing chamber 200 may be a thermal processing chamber and may be used to perform any epitaxial growth process described above. Epitaxial growth of a template layer and an overlying material (e.g., SiGe(B)) may be performed in the processing chamber 200. A purge process may be performed after epitaxial growth of a template layer and before epitaxial growth of the overlying material.

The processing chamber 200 includes a chamber body 202, support systems 204, and a controller 206. The chamber body 202 includes an upper portion 212 and a lower portion 214. The upper portion 212 includes the area within the chamber body 202 between an upper dome 216 and a substrate 201. The lower portion 214 includes the area within the chamber body 202 between a lower dome 230 and the bottom of the substrate 201. Deposition processes generally occur on the upper surface of the substrate 201 within the upper portion 212.

The support system 204 includes components used to execute and monitor pre-determined processes, such as the growth of epitaxial materials in the processing chamber 200. A controller 206 is coupled to the support system 204 and is adapted to control the processing chamber 200 and support system 204. The controller 206 can generally include a central processing unit (CPU), memory, and support circuits. The CPU may be one of any form of a general purpose processor that can be used in an industrial setting. The memory, or non-transitory computer-readable medium, is accessible by the CPU and may be one or more of memory such as random access memory (RAM), read only memory (ROM), floppy disk, hard disk, or any other form of digital storage, local or remote. The support circuits are coupled to the CPU and may comprise cache, clock circuits, input/output subsystems, power supplies, and the like. The various methods disclosed herein may generally be implemented under the control of the CPU by the CPU executing computer instruction code stored in the memory as, e.g., a software routine. When the computer instruction code is executed by the CPU, the CPU controls the processing chamber 200 to perform processes in accordance with the various methods.

The processing chamber 200 includes a plurality of heat sources, such as lamps 235, which are adapted to provide thermal energy to components positioned within the processing chamber 200. For example, the lamps 235 may be adapted to provide thermal energy to the substrate 201, a susceptor 226, and/or a preheat ring 223. The lower dome 230 may be formed from an optically transparent material, such as quartz, to facilitate the passage of thermal radiation therethrough. It is contemplated that lamps 235 may be positioned to provide thermal energy through the upper dome 216 as well as the lower dome 230.

The chamber body 202 includes a plurality of plenums formed therein. The plenums are in fluid communication with one or more gas sources 276, such as a carrier gas, and one or more deposition gases 278, such as precursor gases and/or dopant source gases. For example, a first plenum 220 may be adapted to provide a deposition gas 250 therethrough into the upper portion 212 of the chamber body 202, while a second plenum 224 may be adapted to exhaust the deposition gas 250 from the upper portion 212. In such a manner, the deposition gas 250 may flow parallel to an upper surface of the substrate 201.

In cases where a liquid precursor is used, the processing chamber 200 may include a liquid vaporizer 280 in fluid communication with a liquid precursor source 282. The liquid vaporizer 280 can be used for vaporizing liquid precursors to be delivered to the processing chamber 200. While not shown, it is contemplated that the liquid precursor source 282 may include, for example, one or more ampules of precursor liquid and solvent liquid, a shut-off valve, and a liquid flow meter (LFM).

A substrate support assembly 232 is positioned in the lower portion 214 of the chamber body 202. The substrate support assembly 232 is illustrated supporting a substrate 201 in a processing position. The substrate support assembly 232 includes a susceptor support shaft 227 formed from an optically transparent material and the susceptor 226 supported by the susceptor support shaft 227. A shaft 260 of the susceptor support shaft 227 is positioned within a shroud 231 to which lift pin contacts 242 are coupled. The susceptor support shaft 227 is rotatable in order to facilitate the rotation of the substrate 201 during processing. Rotation of the susceptor support shaft 227 is facilitated by an actuator 229 coupled to the susceptor support shaft 227. The shroud 231 is generally fixed in position, and therefore, does not rotate during processing. Support pins 237 couple the susceptor support shaft 227 to the susceptor 226.

Lift pins 233 are disposed through openings (not labeled) formed in the susceptor support shaft 227. The lift pins 233 are vertically actuatable and are adapted to contact the underside of the substrate 201 to lift the substrate 201 from a processing position (as shown) to a substrate removal position.

The preheat ring 223 is removably disposed on a lower liner 240 that is coupled to the chamber body 202. The preheat ring 223 is disposed around the internal volume of the chamber body 202 and circumscribes the substrate 201 while the substrate 201 is in a processing position. The preheat ring 223 facilitates preheating of a process gas as the process gas enters the chamber body 202 through the first plenum 220 adjacent to the preheat ring 223.

The central window portion 215 of the upper dome 216 and the bottom portion 217 of the lower dome 230 may be formed from an optically transparent material such as quartz. The peripheral flange 219 of the upper dome 216, which engages the central window portion 215 around a circumference of the central window portion 215, the peripheral flange 221 of the lower dome 230, which engages the bottom portion around a circumference of the bottom portion, may all be formed from an opaque quartz to protect the O-rings 222 proximity to the peripheral flanges from being directly exposed to the heat radiation. The peripheral flange 219 may be formed of an optically transparent material such as quartz.

While the foregoing is directed to various examples of the present disclosure, other and further examples may be devised without departing from the basic scope thereof, and the scope thereof is determined by the claims that follow.

The invention claimed is:

1. A method for semiconductor processing, the method comprising:

epitaxially growing a silicon germanium template layer on a substrate, epitaxially growing the silicon germanium template layer comprising using a first germanium source precursor and a first silicon source precursor, and being performed with a first substrate temperature in a range from 600° C. to 650° C., the silicon germanium template layer having a (100) surface of silicon germanium on a substrate, wherein:

a ratio of a flow rate of the first germanium source precursor and a flow rate of the first silicon source precursor during the epitaxially growing the silicon germanium template layer is between 1:5 and 1.5:1; and epitaxially growing an epitaxial silicon germanium on the (100) surface of silicon germanium, epitaxially growing the epitaxial silicon germanium comprising using a second germanium source precursor, a dopant precursor comprising boron, and a second silicon source precursor, and being performed at a second substrate temperature, the second germanium source precursor comprising a chlorinated germane gas, wherein:

a ratio of a flow rate of the second germanium source precursor and a flow rate of the second silicon source precursor during the epitaxially growing the epitaxial silicon germanium is between 1:5 and 1.5:1, a first growth rate of the epitaxial silicon germanium being in a first direction perpendicular to the (100) surface of silicon germanium, a second growth rate of the epitaxial silicon germanium being in a second direction perpendicular to the first direction, and the first growth rate being at least 5 times greater than the second growth rate.

2. The method of claim 1, wherein the chlorinated germane gas comprises germanium tetrachloride ($GeCl_4$).

3. The method of claim 1, wherein the second substrate temperature is in a range from 540° C. to 600° C.

4. The method of claim 1, further comprising etching the silicon germanium template layer on the substrate to form a recess, a surface of the recess being the (100) surface of silicon germanium.

5. The method of claim 1, wherein the epitaxial silicon germanium forms at least a portion of a source/drain region on a fin on the substrate.

6. The method of claim 1, wherein the silicon germanium template layer comprises $Si_{1-x}Ge_x$ where x is in a range from 10 to 30 and the epitaxial silicon germanium comprises $Si_{1-y}Ge_y$ where y is in a range from 30 to 50.

7. A method for semiconductor processing, the method comprising:

epitaxially growing a silicon germanium template layer on a substrate, epitaxially growing the silicon germanium template layer comprising using a first germanium source precursor and a first silicon source precursor, and being performed with a first substrate temperature in a range from 600° C. to 650° C., the silicon germanium template layer having a (100) surface of silicon germanium, wherein:

a flow rate of the first germanium source precursor is between 10 sccm and 200 sccm, a flow rate of the first silicon source precursor is between 100 and 1000 sccm, and a ratio of the flow rate of the first germanium source precursor and the flow rate of the first silicon source precursor during the epitaxially growing the silicon germanium template layer is between 1:5 and 1.5:1; and epitaxially growing an epitaxial silicon germanium on the (100) surface of silicon germanium, epitaxially growing the epitaxial silicon germanium comprising using a second germanium source precursor, a dopant precursor comprising boron, and a second silicon source precursor, and being performed at a second substrate temperature, the second germanium source precursor comprising a chlorinated germane gas, wherein:

a flow rate of the second germanium source precursor is between 10 sccm and 200 sccm, a flow rate of the second silicon source precursor is between 100 and 1000 sccm, and a ratio of the flow rate of the second germanium source precursor and the flow rate of the second silicon source precursor during the epitaxially growing the epitaxial silicon germanium is between 1:5 and 1.5:1.

8. The method of claim 7, wherein the chlorinated germane gas is germanium tetrachloride ($GeCl_4$).

9. The method of claim 7, wherein the first silicon source precursor comprises silane ($SiH_4$).

10. The method of claim 7, wherein epitaxially growing the epitaxial silicon germanium grows the epitaxial silicon germanium in a <100> direction without substantial growth in a <010> direction.

11. The method of claim 7, further comprising forming a recess in a silicon germanium layer, the (100) surface of silicon germanium being a bottom surface of the recess.

12. The method of claim 7, wherein the second substrate temperature is in a range from 540° C. to 600° C.

13. The method of claim 7, wherein the silicon germanium template layer comprises $Si_{1-x}Ge_x$ where x is in a range from 10 to 30 and the epitaxial silicon germanium comprises $Si_{1-y}Ge_y$ where y is in a range from 30 to 50.

14. The method of claim 7, wherein the epitaxial silicon germanium forms at least a portion of a source/drain region on a fin on the substrate.

15. A semiconductor processing system comprising:

a non-transitory computer-readable medium storing instructions that, when executed by a processor, cause a computer system to perform operations of:

epitaxially growing a silicon germanium template layer on a substrate, epitaxially growing the silicon germanium template layer comprising using a first germanium source precursor, a first silicon source precursor, and an etchant gas comprising at least one of hydrochloric acid (HCl), chlorine ($Cl_2$), hydrogen bromide (HBr), or bromine ($Br_2$), and being performed with a first substrate temperature in a range from 600° C. 650° C., the silicon germanium template layer having a (100) surface of silicon germanium, wherein:

a flow rate of the first germanium source precursor is between 10 sccm and 200 sccm, a flow rate of the first silicon source precursor is between 100 and 1000 sccm, and a ratio of the flow rate of the first germanium source precursor and the flow rate of the first silicon source precursor during the epitaxially growing the silicon germanium template layer is between 1:5 and 1.5:1; and epitaxially growing an epitaxial silicon germanium on the (100) surface of silicon germanium, the (100) surface of silicon germanium being on a substrate, epitaxially growing the epitaxial silicon germanium comprising using a second germanium source precursor, a dopant precursor comprising boron, and a second silicon source precursor, and being performed at a second substrate temperature, the second germanium source precursor comprising a chlorinated germane gas, wherein:

a flow rate of the second germanium source precursor is between 10 sccm and 200 sccm, a flow rate of the second silicon source precursor is between 100 and 1000 sccm, and a ratio of the flow rate of the second germanium source precursor and the flow rate of the second silicon source precursor during the epitaxially growing the epitaxial silicon germanium is between 1:5 and 1.5: 1.

16. The semiconductor processing system of claim 15, wherein the chlorinated germane gas is germanium tetra-chloride ($GeCl_4$).

17. The semiconductor processing system of claim 15, wherein the first silicon source precursor comprises silane ($SiH_4$).

18. The semiconductor processing system of claim 15, wherein epitaxially growing the epitaxial silicon germanium grows the epitaxial silicon germanium in a <100> direction without substantial growth in a <010> direction.

19. The semiconductor processing system of claim 15, wherein the silicon germanium template layer comprises $Si_{1-x}Ge_x$ where x is in a range from 10 to 30 and the epitaxial silicon germanium comprises $Si_{1-y}Ge_y$ where y is in a range from 30 to 50.

\* \* \* \* \*